United States Patent [19]

Parker

[11] Patent Number: 5,144,170
[45] Date of Patent: Sep. 1, 1992

[54] CIRCUIT AND METHOD OF ALIGNING CLOCK SIGNALS

[75] Inventor: Lanny L. Parker, Mesa, Ariz.

[73] Assignee: Motorola, Inc., Schaumburg, Ill.

[21] Appl. No.: 723,098

[22] Filed: Jun. 28, 1991

[51] Int. Cl.$^5$ .............................................. H03K 9/06
[52] U.S. Cl. .................................... 307/528; 307/511;
307/525; 307/529; 307/269; 328/63
[58] Field of Search ............... 307/511, 525, 529, 528,
307/269; 328/63

[56] References Cited

U.S. PATENT DOCUMENTS

| | | | |
|---|---|---|---|
| 3,997,872 | 12/1976 | Cane et al. | 307/528 |
| 4,471,299 | 9/1984 | Elmis | 307/269 |
| 4,719,365 | 1/1988 | Misono | 307/269 |
| 4,736,162 | 4/1988 | Ishihara | 328/63 |
| 4,771,441 | 9/1988 | Spengler et al. | 328/63 |
| 4,912,564 | 3/1990 | Saitoh | 328/63 |
| 4,973,860 | 11/1990 | Ludwig | 328/63 |
| 4,988,901 | 1/1991 | Kamuro et al. | 307/525 |

Primary Examiner—Stanley D. Miller
Assistant Examiner—Scott A. Ouellette
Attorney, Agent, or Firm—Robert D. Atkins

[57] ABSTRACT

A clock alignment circuit is responsive to a high speed clock signal for generating a low speed clock signal. A clock generator circuit monitors the phase difference between the high speed clock signal and the low speed clock signal and develops a control signal in response thereto during a time slot window signal for adjusting the transitions of the low speed clock signal to align with the high speed clock signal. The clock generator circuit is placed in the vicinity of the associated utilization circuit to that the low speed and high speed clock signals maintain alignment.

16 Claims, 8 Drawing Sheets

HSCLK $\overline{HSCLK}$

WINDOW

CYCLE $\overline{DOWN}$

LSCLK1

$t_1\ t_2\ t_3\ t_4$

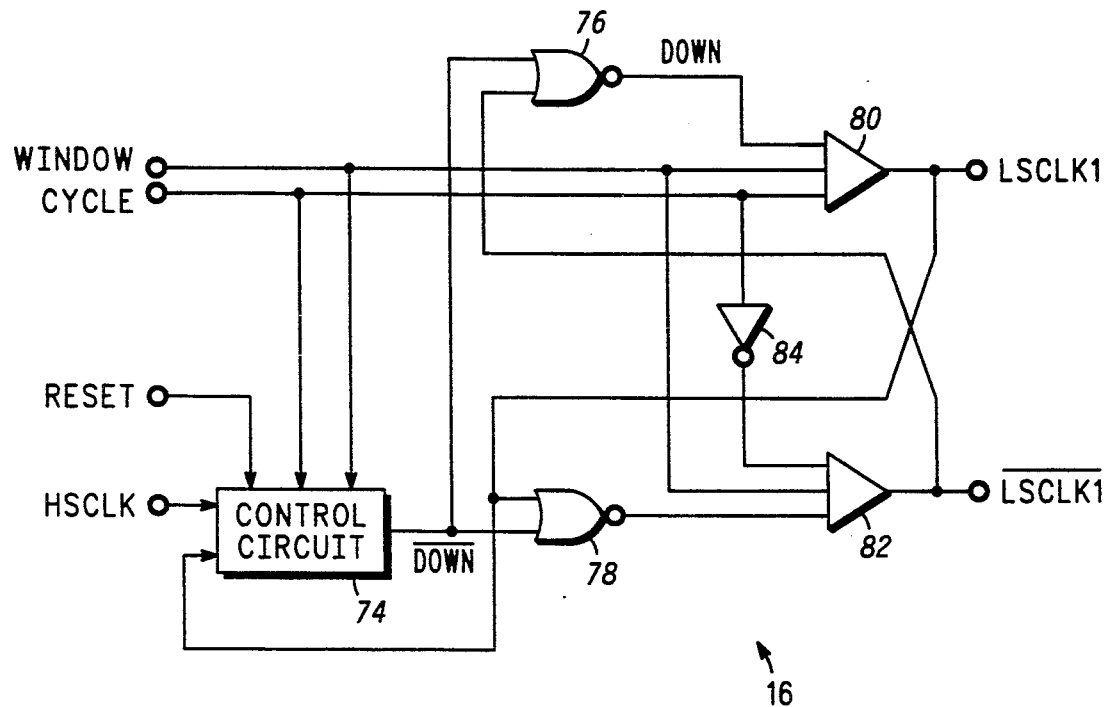
FIG. 5
FIG. 6
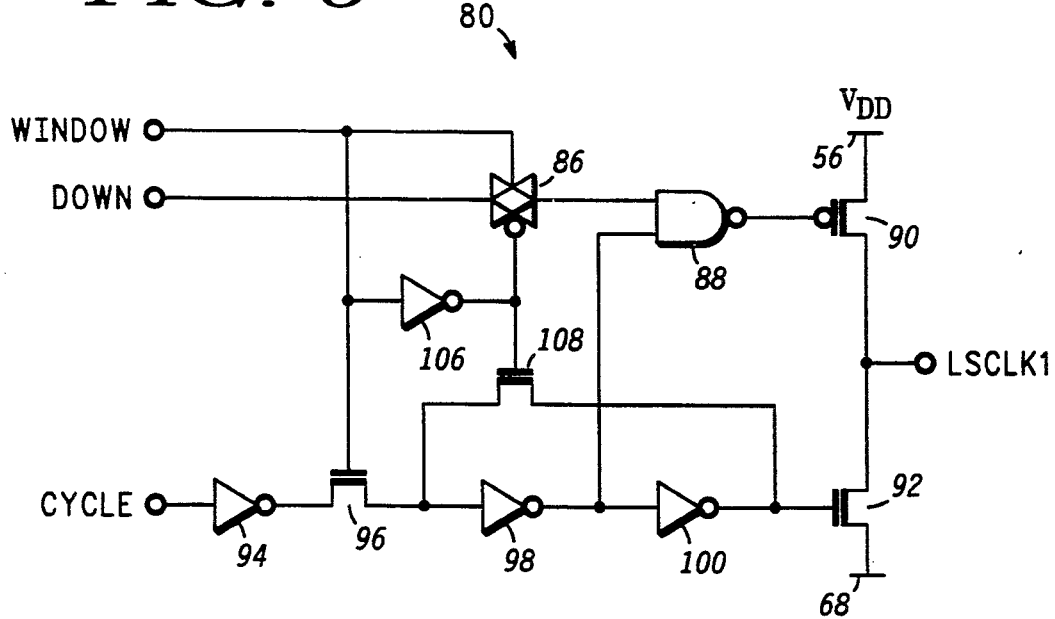

CIRCUIT AND METHOD OF ALIGNING CLOCK SIGNALS

BACKGROUND OF THE INVENTION

This invention relates in general to digital clock circuits and, more particularly, to a digital clock circuit for aligning the edges of a low speed clock signal to a high speed clock signal.

Many digital systems use two or more clock signals operating at different frequencies for transferring data through the system. A common procedure for generating a high frequency clock and a low frequency clock is to feed an external clock source into a phase lock loop (PLL) and develop the high speed clock signal at the output of the voltage controlled oscillator (VCO) of the PLL. The low speed clock may be taken at the output of a divide-by-N circuit in the feedback path between the output of the VCO and the phase detector of the PLL, as is well understood. The high speed and low speed clock signals are routed throughout the system to perform the intended functions.

The logic circuit using the high speed and low speed clock signals may be a considerable distance from the PLL generation source. Therefore, the transitions of the high speed clock signal and the low speed clock signal can become mis-aligned at various points in the system primarily due to differences in propagation delay and capacitive loading in the different paths. In many applications, it is critical to have accurate alignment of the high speed clock signal and the low speed clock signal at the point of utilization. Otherwise, data may be clocked at the wrong points resulting in invalid data transfers. Thus, circuit designers have typically invested considerable time and effort into detailed analysis of the propagation paths to ensure proper alignment of the high speed and low speed clock signals at key points in the system. Unfortunately, the difficulty in aligning the clock edges of the different frequency clock signals often forces the designers to use more setup and hold time for the data transfers which limits the operating speed and bandwidth of the system.

Hence, what is needed is an improved clock generation circuit for providing proper alignment between the clock edges of the high speed and low speed clock signals at the point of usage.

SUMMARY OF THE INVENTION

Briefly stated, the present invention comprises a circuit for aligning a first clock signal to a second clock signal comprising a first circuit for generating a time slot window signal in response to the second clock signal, and a second circuit having first and second inputs coupled for receiving the second clock signal and the time slot window signal respectively and having an output for providing the first clock signal. The second circuit detects a phase difference between the first clock signal and the second clock signal during the time slot window signal and adjusts the transition of the first clock signal to align with the second clock signal.

In another aspect, the present invention is a method of aligning a first clock signal to a second clock signal comprising the steps of generating a time slot window signal in response to the second clock signal, detecting a phase difference between the first clock signal and the second clock signal during the time slot window signal, and adjusting the transition of the first clock signal according to the phase difference to align with the second clock signal.

Thus, one advantage of the present invention is the technique of monitoring the phase relationship between a high speed clock signal and a low speed clock signal during a time slot window and adjusting the transitions of the latter to bring the two in alignment.

BRIEF DESCRIPTION OF THE DRAWING

FIG. 5 is a schematic and block diagram illustrating the low speed clock generator of FIG. 1;

FIG. 6 is a schematic diagram illustrating the clock driver of FIG. 5;

DETAILED DESCRIPTION OF THE PREFERRED EMBODIMENT

Figure 1:
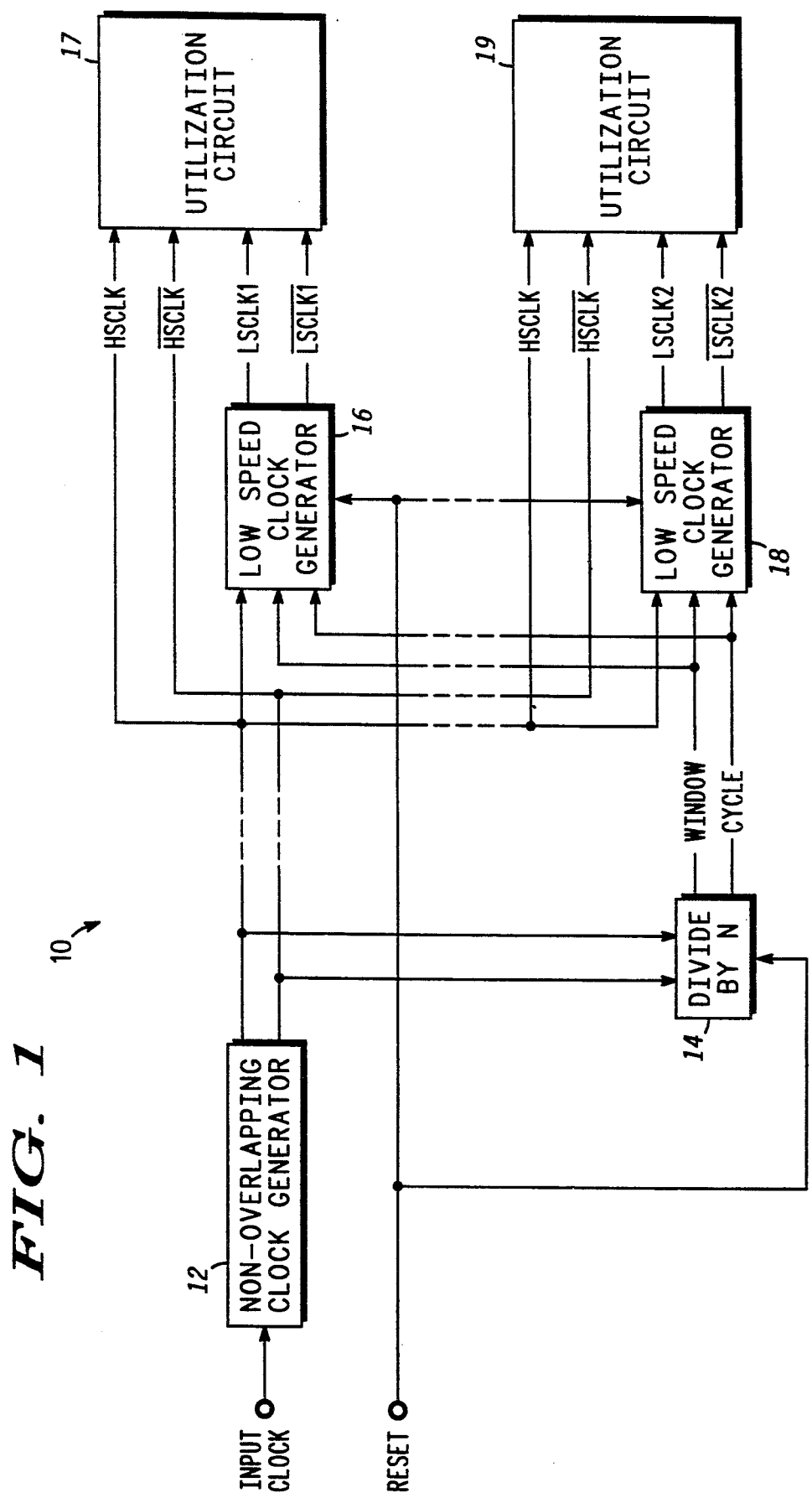
FIG. 1 is a block diagram illustrating a clock alignment circuit in accordance with the present invention.

A clock alignment circuit 10 in accordance with the present invention is shown in FIG. 1 suitable for manufacturing as an integrated circuit using conventional integrated circuit processes. An input clock signal INPUT CLOCK is applied to non-overlapping clock generator circuit 12 of circuit 10 for providing a high speed clock signal HSCLK and its complement $\overline{\text{HSCLK}}$, wherein the HSCLK clock signal operates at frequency and in-phase with the INPUT CLOCK signal while the $\overline{\text{HSCLK}}$ clock signal is non-overlapping such that the HSCLK and $\overline{\text{HSCLK}}$ clock signals are never logic one simultaneously. A typical operating frequency for the HSCLK clock signal is 32 MHz. The HSCLK clock signal is processed through divide-by-N circuit 14 for providing control signals WINDOW and CYCLE.

A low speed clock generator 16 receives the HSCLK clock signal and control signals WINDOW and CYCLE for generating the low speed clock signal LSCLK1 and its complement $\overline{\text{LSCLK1}}$ for a first utilization circuit 17 which also operates with the HSCLK and $\overline{\text{HSCLK}}$ clock signals. The function of low speed clock generator 16 is to align the LSCLK1 and $\overline{\text{LSCLK1}}$ clock signals to the HSCLK clock signal as applied at the input thereof. Although there may be a considerable physical distance between non-overlapping clock generator 12 and divide-by-N circuit 14 on one side of the system and low speed clock generator 16 and utilization circuit 17 on the other side, one can be assured of proper alignment between the high speed and low speed clock signals by locating low speed clock generator 16 in the vicinity of utilization circuit 17 since the distances are short.

The HSCLK clock signal and the LSCLK1 and $\overline{\text{LSCLK1}}$ clock signals are in alignment when the low-high and high-low transitions of the respective clock signals occur within a predetermined time of one another. In the present embodiment, the predetermined time is two inverter delays, or approximately 500 picoseconds in a 250 nanosecond period of the LSCLK1 clock signal.

Similarly, low speed clock generator 18 receives the HSCLK clock signal and control signals WINDOW and CYCLE for providing low speed clock signal LSCLK2 and its complement $\overline{\text{LSCLK2}}$ to a second utilization circuit 19 also operating with the HSCLK and $\overline{\text{HSCLK}}$ clock signals. The LSCLK2 and $\overline{\text{LSCLK2}}$ clock signals are aligned to the HSCLK clock signal at the output of low speed clock generator 18 which is located in the vicinity of utilization circuit 19. Again, there may be considerable distance between non-overlapping clock generator 12 and divide-by-N circuit 14 on one side of the system and low speed clock generator 18 and utilization circuit 19 on the other side. Thus, by locating low speed clock generator circuit 18 in the vicinity of utilization circuit 19, the high speed and low speed clock signals remain in alignment. In order to ensure that the LSCLK1 and $\overline{\text{LSCLK1}}$ clock signals are aligned to the LSCLK2 and $\overline{\text{LSCLK2}}$ clock signals, it is important for the HSCLK clock signal at the input of low speed clock generator 16 align with the same signal at the input of low speed clock generator 18. Thus, the propagation paths for the HSCLK and $\overline{\text{HSCLK}}$ clock signals should be carefully buffered and properly laid-out.

The LSCLK1 and $\overline{\text{LSCLK1}}$ clock signals are generated in low speed clock generator 16 at a four MHz rate by the HSCLK clock signal under control of the WINDOW signal and the CYCLE signal. The LSCLK1 and $\overline{\text{LSCLK1}}$ clock signals change state in response to a control signal $\overline{\text{DOWN}}$ developed internal to low speed clock generator 16. The high state of the WINDOW signal establishes a time slot during which the phase of the LSCLK1 clock signal is compared to that of the HSCLK clock signal. Based on the phase difference between the LSCLK1 and HSCLK clock signals, the assertion point of the $\overline{\text{DOWN}}$ signal is adjusted within the WINDOW signal to move the transition (change of state) of the LSCLK1 clock signal in alignment with the HSCLK clock signal. The CYCLE signal controls the next state of the LSCLK1 clock signal. This operation is repeated in low speed clock generator 18 for providing alignment between the LSCLK2 and HSCLK clock signals.

Figure 2:
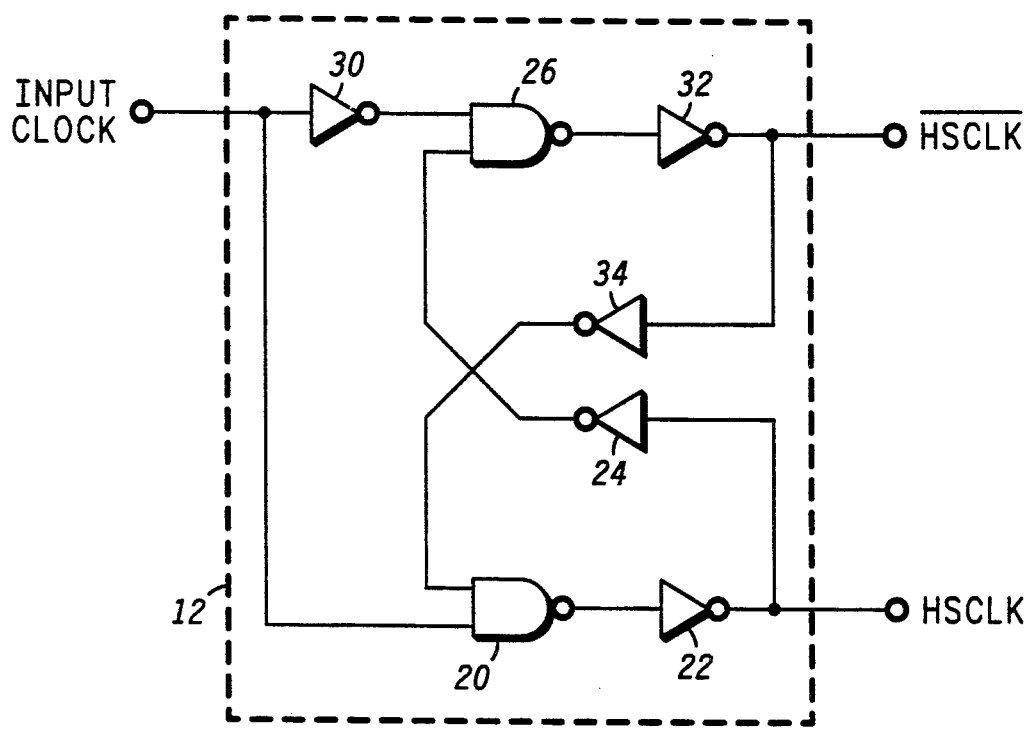
FIG. 2 is a schematic diagram illustrating the non-overlapping clock generator of FIG. 1.

Non-overlapping clock generator 12 is shown in FIG. 2 including NAND gate 20 having a first input coupled for receiving the 32 MHz INPUT CLOCK signal and an output coupled through inverter 22 for providing the in-phase HSCLK clock signal. The output of inverter 22 is also coupled through inverter 24 to the first input of NAND gate 26, while the second input of the same receives the INPUT CLOCK signal complemented by inverter 30. The output signal of NAND gate 26 drives inverter 32 for providing the $\overline{\text{HSCLK}}$ clock signal which is also applied through inverter 34 to the second input of NAND gate 20.

When the INPUT CLOCK signal is logic one, the in-phase HSCLK clock signal is also logic one which produces logic zeroes at the first and second inputs of NAND gate 26. The output of NAND gate 26 is logic one and the $\overline{\text{HSCLK}}$ clock signal is logic zero. The first and second inputs of NAND gate 20 are thus logic one and its output is logic zero leaving the in-phase HSCLK clock signal at logic one as per the initial condition.

As the INPUT CLOCK signal falls to a logic zero, the output of NAND gate 20 becomes logic one forcing the in-phase HSCLK clock signal to transition to logic zero. The logic zero INPUT CLOCK signal also produces a logic one at the second input of NAND gate 26. However, the output of NAND gate 26 cannot change to logic zero until the in-phase HSCLK clock signal switches to logic zero. Hence, the $\overline{\text{HSCLK}}$ clock signal remains logic zero until in-phase HSCLK clock signal becomes logic zero since the latter provides the second logic one at the first input of NAND gate 26 necessary to switch the $\overline{\text{HSCLK}}$ clock signal to logic one.

A similar logic operation is provided on the opposite edge wherein the in-phase HSCLK clock signal cannot transition to logic one until the $\overline{\text{HSCLK}}$ clock signal changes to logic zero. The non-overlapping period is determined by the delay through inverters 24 and 34 and may be adjusted by sizing the transistors thereof. Thus, the HSCLK and $\overline{\text{HSCLK}}$ clock signals are complementary and non-overlapping such that logic ones never appear simultaneously.

Figure 3:
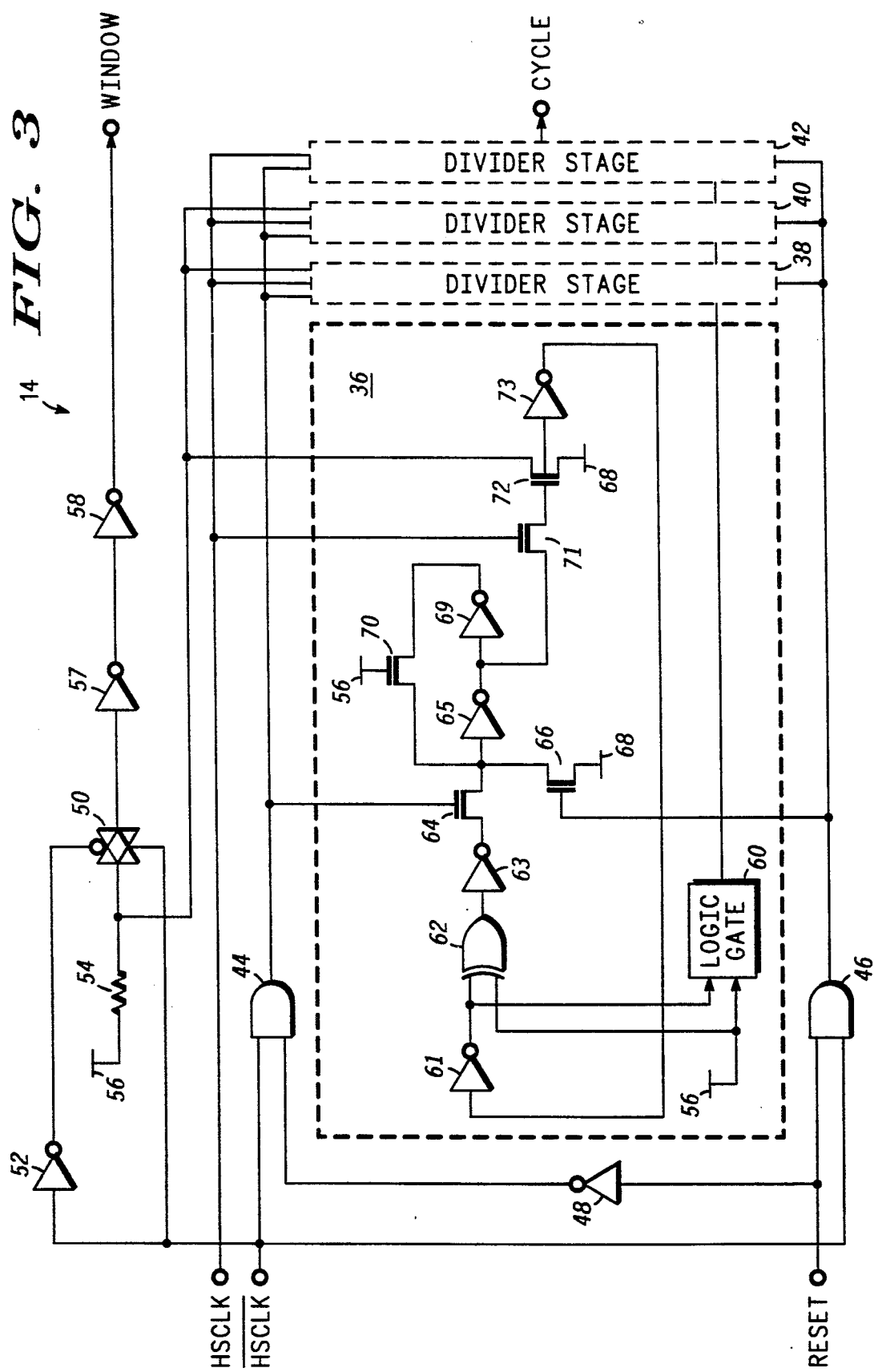
FIG. 3 is a schematic diagram illustrating the divide-by-N circuit of FIG. 1.

Turning to FIG. 3, divide-by-N circuit 14 is shown, wherein the HSCLK clock signal is applied to divider stages 36, 38, 40 and 42. The $\overline{\text{HSCLK}}$ clock signal is applied at the first input of AND gate 44, while the output of AND gate 44 is coupled to divider stages 36-42. The RESET signal is applied at the first input of AND gate 46 and through inverter 48 to the second input of AND gate 44. The output of AND gate 46 is also coupled to divider stages 36-42. The $\overline{\text{HSCLK}}$ clock signal is applied at the non-inverted control input of transmission gate 50 and through inverter 52 to the inverted control input of the same. The input of transmission gate 50 is coupled through pull-up resistor 54 to power supply conductor 56 typically operating at a positive potential such as $V_{DD}$, while the output of transmission gate 50 provides the WINDOW signal buffered by inverters 57 and 58.

Since divider stages 36-42 follow a similar construction, only divider stage 36 is shown in detail including logic gate 60 having a first input coupled to power supply conductor 56 and an output coupled to the first input of logic gate 60 in divider stage 38. Logic gate 60 is a NAND gate in divider stages 36 and 40 and a NOR gate in divider stages 38 and 42. The output of inverter 61 is coupled to the second input of logic gate 60 and to the first input of exclusive-OR gate 62, while the output of exclusive-OR gate 62 is coupled through inverter 63 to the drain of transistor 64. The second input of exclusive-OR gate 62 is coupled to the first input of logic gate 60. The gate of transistor 64 is coupled to the output of AND gate 44, and the source of transistor 64 is coupled to the input of inverter 65 and to the drain of transistor 66. The gate of transistor 66 is coupled to the output of AND gate 46, and its source is coupled to power supply conductor 68 operating at ground potential. The output of inverter 65 is coupled through inverter 69 and through the drain-source conduction path of transistor 70 back to the input of inverter 65. The gate of transistor 70 is coupled to power supply conductor 56. The output of inverter 65 is also coupled to the drain of transistor 71 which includes a gate coupled for receiving the HSCLK clock signal and a source coupled to the gate of transistor 72 and to the input of inverter 73. The drain of transistor 72 is coupled to the input of transmission gate 50, and the source of transistor 72 is coupled to power supply conductor 68. The output of inverter 73 is coupled back to the input of inverter 61.

Divider stages 38-42 also include transistors 64 and 66 having their gates coupled to the output of AND gates 44 and 46, respectively. Furthermore, transistors like 71 in divider stages 38-42 each have a gate coupled for receiving the HSCLK clock signal, and transistors like 72 in divider stages 38-40 each have a drain coupled to the input of transmission gate 50. The output of inverter 73 in divider stage 42 provides the CYCLE signal. Divider stages 38 and 42 do not use inverters 61 and 63, and divider stage 42 does not use a transistor like 72.

To initialize clock alignment circuit 10 to a known state, the RESET signal is asserted as a logic one which, in combination with the next high state of the $\overline{\text{HSCLK}}$ clock signal, produces a logic one at the gate of transistor 66, thereby turning it on and pulling the input of inverter 65 to a logic zero at power supply conductor 68. Inverter 48 produces a logic zero at the output of AND gate 44, turning off transistor 64 and removing gates 60-63 from consideration. The logic one at the output of inverter 65 passes through transistor 71 during the next high state of the HSCLK clock signal and turns on transistor 72 pulling the input of transmission gate 50 to logic zero. The next high state of the $\overline{\text{HSCLK}}$ clock signal also enables transmission gate 50 to pass the logic zero through inverters 57-58 and provide a low WINDOW signal. The output of inverter 73 also becomes logic zero from the logic one at the gate of transistor 72. The logic one at the output of AND gate 46 produces a logic zero at the output of each inverter 73 in divider stages 38-42, thereby providing a logic zero CYCLE signal. The RESET signal is then released to logic zero, turning off transistor 66 and allowing clock alignment circuit 10 to operate normally.

Divider stages 36-42 each operate as a divide-by-2 circuit with a carry-over at the output of logic gate 60. Thus, the frequency at the output of inverter 73 of divider stage 36 is one-half that of the HSCLK clock signal. Likewise, the output signals of inverters 73 in divider stages 38 and 40 are one-half that of the previous stage. The input of transmission gate 50 is logic one only when the outputs of inverters 73 in divider stages 36-40 are all logic one (logic zeroes at the gates of transistors 72) which occurs once every eight periods of the HSCLK clock signal. Thus, the combination of divider stages 36-40 is a divide-by-8 ripple counter for providing the WINDOW signal operating at one-eighth the frequency of the HSCLK clock signal, i.e., four MHz. Divider stage 42 is another divide-by-2 circuit for providing the CYCLE signal operating at one-half the rate of the WINDOW signal, or two MHz. A functional description of divider stages 36-40 is provided in "Motorola Technical Developments Journal", volume 12, Apr., 1991, page 91.

The previous initialization cycle left a logic zero at the output of inverter 73 in each of divider stages 36-42 and logic ones at the inputs of exclusive-OR gate 62 of divider stage 36. Inverter 63 complements the logic zero from the output of exclusive-OR gate 62, allowing transistor 64 to pass a logic one to inverter 65 during the high state of the $\overline{\text{HSCLK}}$ clock signal. The output of inverter 65 becomes logic zero which reaches the gate of transistor 72 during the following high state of the HSCLK clock signal, thereby turning transistor 72 off and switching the output of inverter 73 to logic one. The logic one at the input of inverter 61 processes though divider circuit 36 during the following period of the HSCLK clock signal and switches the output of inverter 73 back to logic zero.

Thus, the output signal of inverter 73 in divider stage 36 changes state once every period of the HSCLK clock signal for providing a divide-by-2 operation. Moreover, the output of logic gate 60 of divider stage 36 also changes state once every period of the HSCLK clock signal. Since the output of logic gate 60 (NAND gate) of divider stage 36 is the first input of logic gate 60 (NOR gate) in divider stage 38, the latter operates as a divide-by-2 of the output signal of divider stage 36. The same is true for divider stages 40 and 42, wherein the output of logic gate 60 of divider 38 is coupled to the first input of logic gate 60 in divider stage 40 and the output of logic gate 60 of divider 40 feeds the first input of logic gate 60 in divider stage 42. One complete cycle at the output of inverter 73 of any divider stage (logic zero-to-logic one-to-logic zero) causes the inverter 73 in the subsequent divider stage to change state once. Eventually, the CYCLE signal at the output of inverter 73 in divider stage 42 becomes logic one.

For seven consecutive periods of the HSCLK clock signal, one or more of transistors like 72 in divider stages 36-40 are conducting, pulling the input of transmission gate 50 to logic zero. Once every eight periods of the HSCLK clock signal, i.e., at time $t_1$ of FIG. 4A, transistors 72 in divider stage 36-40 are all off and the input of transmission gate 50 is pulled to a logic one by resistor 54. At time $t_2$, the $\overline{\text{HSCLK}}$ clock signal in FIG. 4B becomes logic one to enable transmission gate 50 and pass the logic one through inverters 57-58 as the WINDOW signal in FIG. 4C. The following period of the HSCLK clock signal switches the gate of transistor 72 of divider stage 36 back to logic one, pulling the input of transmission gate 50 to logic zero. The positive transition of the $\overline{\text{HSCLK}}$ clock signal at time $t_4$ passes the logic zero through inverters 57-58 to bring the WINDOW signal low again. The CYCLE signal also drops to logic zero at time $t_4$ in FIG. 4D.

As will be shown, divide-by-N circuit 14 provides the WINDOW signal for establishing a time slot during its high state in which to compare the phase difference between the HSCLK and LSCLK1 clock signals, while the CYCLE signal controls the next state of the LSCLK1 clock signal.

Low speed clock generator 16 is shown in FIG. 5 including control circuit 74 coupled for receiving the WINDOW signal, the CYCLE signal, the HSCLK signal, the LSCLK1 signal and the RESET signal for providing the $\overline{\text{DOWN}}$ signal at the first inputs of NOR gates 76 and 78. The output of NOR gate 76 is coupled to the first input of clock driver circuit 80, the output of which provides the LSCLK1 clock signal. Likewise, the output of NOR gate 78 is coupled to the first input of clock driver circuit 82, while the output of the same provides the $\overline{\text{LSCLK1}}$ clock signal. The LSCLK1 and $\overline{\text{LSCLK1}}$ clock signals are applied back at the second inputs of NOR gates 78 and 76, respectively. The WINDOW signal is applied at the second inputs of clock driver circuits 80 and 82, and the CYCLE signal is applied at the third input of clock driver circuit 80 and through inverter 84 to the third input of clock driver circuit 82.

Further detail of clock driver circuit 80 is illustrated in FIG. 6, wherein the DOWN signal from the output of NOR gate 76 is applied through transmission gate 86 to the first input of NAND gate 88. The output of NAND gate 88 is coupled to the gate of transistor 90 which includes a source coupled to power supply conductor 56, and a drain coupled to the drain of transistor 92 for providing the LSCLK1 clock signal at the output of clock driver circuit 80. The CYCLE signal is applied through inverter 94 to the drain of transistor 96, while the source of transistor 96 is coupled through inverters 98 and 100 to the gate of transistor 92. The source of transistor 92 is coupled to power supply conductor 68. The WINDOW signal is applied at the gate of transistor 96 and at the non-inverted control input of transmission gate 86. The WINDOW signal is also complemented by inverter 106 and applied at the gate of transistor 108 and at the inverted control input of transmission gate 86. Transistor 108 includes a drain coupled to the output of inverter 100 and a source coupled to the input of inverter 98. The output of inverter 98 is coupled to the second input of NAND gate 88. Clock driver circuit 82 follows a similar construction as described for clock driver circuit 80.

The operation of low speed clock generator 16 proceeds as follows with reference to FIGS. 4A-4F. As previously described, the WINDOW signal establishes a time slot between times $t_2$ and $t_4$ of FIG. 4C during which the HSCLK and LSCLK1 clock signals are phase compared by control circuit 74. Control circuit 74 asserts a logic zero $\overline{DOWN}$ signal at a particular time during the high state of the WINDOW signal corresponding to the phase difference between the HSCLK and LSCLK1 clock signals as necessary to bring the LSCLK1 clock signal in alignment with the HSCLK clock signal. NOR gates 76 and 78 operate as inverters when the $\overline{DOWN}$ signal is logic zero, providing the opposite states of the LSCLK1 and $\overline{LSCLK1}$ clock signals at the first inputs of clock driver circuits 82 and 80, respectively.

At time $t_2$, the CYCLE signal is logic one for clock driver circuit 80 and logic zero by inverter 84 for clock driver circuit 82. The LSCLK1 clock signal is logic zero and the $\overline{DOWN}$ signal is logic one and the DOWN signal at the output of NOR gate 78 is logic zero. In clock driver circuit 82, the high state of the WINDOW signal just after time $t_2$ enables transmission gate 86 to pass the logic zero to NAND gate 88 and turn off transistor 90. The logic zero CYCLE signal at the output of inverter 84 is complemented again by inverter 94 and passes through transistor 96 and inverters 98-100, thereby turning on transistor 92 and pulling the $\overline{LSCLK1}$ clock signal to logic zero. Control circuit 74 issues a logic zero $\overline{DOWN}$ signal at time $t_3$ which combines with the logic zero $\overline{LSCLK1}$ clock signal to produce a logic one DOWN signal at the output of NOR gate 76.

Referring now to clock driver circuit 80, the high state of the WINDOW signal enables transmission gate 86 to pass the logic one from the output of NOR gate 76 to NAND gate 88. The CYCLE signal is also logic one at the output of inverter 98, producing a logic zero at the output of NAND gate 88 to turn on transistor 90 and pull the LSCLK1 clock signal to logic one. The logic one CYCLE signal is complemented three times by inverters 94, 98 and 100 finally turning off transistor 92 with a logic zero. Transistor 108 locks the logic zero at the gate of transistor 92 after time $t_4$ when the WINDOW signal returns to logic zero.

Eight HSCLK clock periods later, the LSCLK1 clock signal switches back to logic zero with the rising edge of the WINDOW signal, followed by the $\overline{LSCLK1}$ clock signal returning to logic one as the $\overline{DOWN}$ signal is asserted as a logic zero. Thus, the LSCLK1 and $\overline{LSCLK1}$ clock signals change state during the WINDOW signal at the falling edge of the $\overline{DOWN}$ signal which is determined from a phase comparison of the HSCLK and LSCLK1 clock signals in control circuit 74. The CYCLE signal determines the next state of the LSCLK1 and $\overline{LSCLK1}$ clock signals. Both the WINDOW signal and the CYCLE signal are derived as a fractional frequency of the HSCLK clock signal. Low speed clock generator 18 follows the same construction and operation as low speed clock generator 16.

Figure 7:
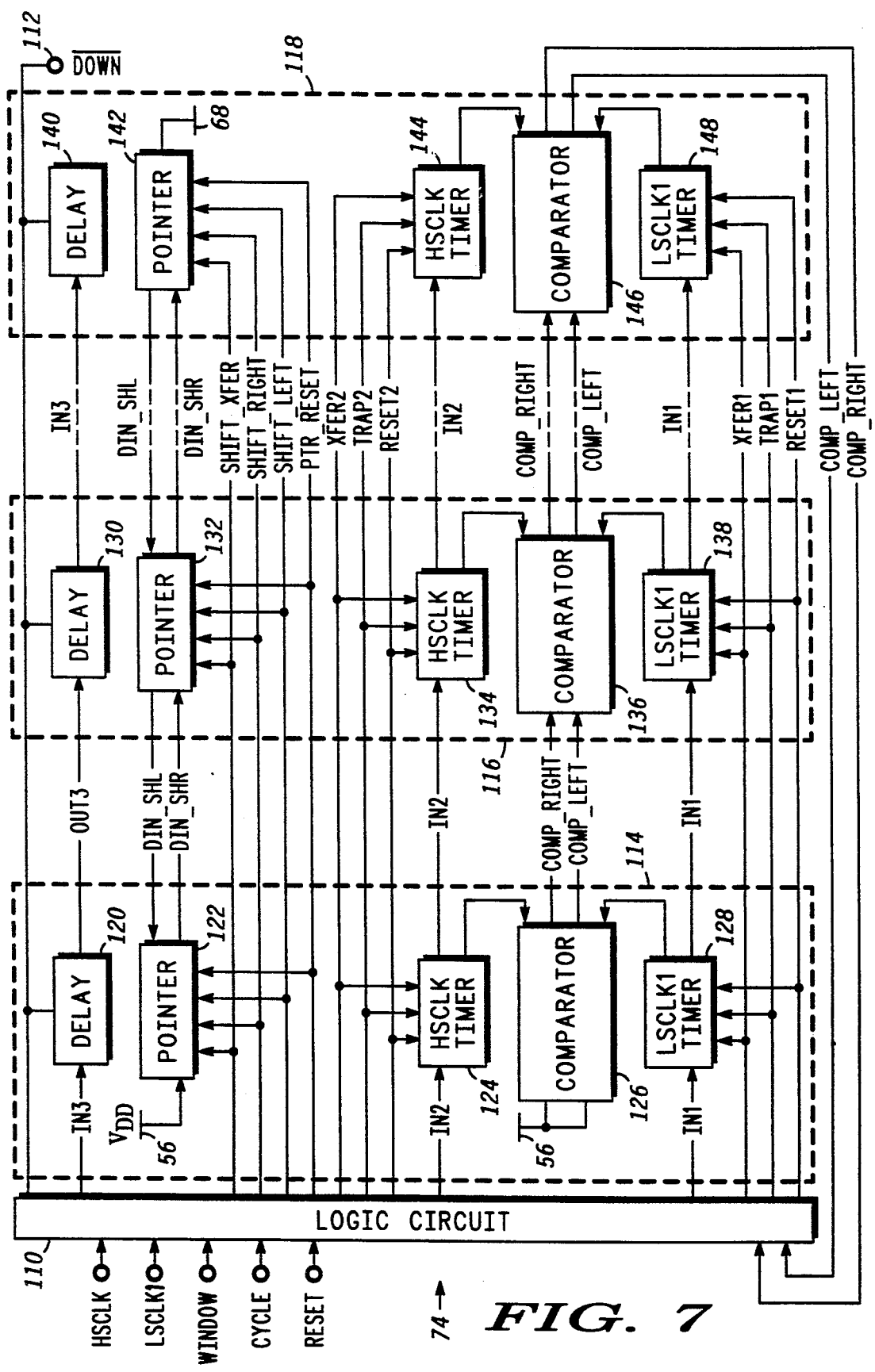
FIG. 7 is a simplified block diagram illustrating the control circuit for FIG. 5.

Referring to FIG. 7, the details of control circuit 74 are illustrated including logic circuit 110 responsive to the HSCLK, LSCLK1, WINDOW, CYCLE and RESET signals for providing a plurality of control signals including the $\overline{DOWN}$ signal on conductor 112. The remainder of control circuit 74 comprises bit columns 114, 116 and 118 responsible for comparing the phase difference between the HSCLK and LSCLK1 clock signals and updating a pointer word which controls the transition point of the $\overline{DOWN}$ signal within the WINDOW pulse to achieve alignment between the HSCLK and LSCLK1 clock signals.

Bit column 114 includes delay circuit 120, pointer 122, HSCLK timer 124, comparator 126 and LSCLK1 timer 128. Bit column 116 comprises delay circuit 130, pointer 132, HSCLK timer 134, comparator 136 and LSCLK1 timer 138, while bit column 118 includes delay circuit 140, pointer 142, HSCLK timer 144, comparator 146 and LSCLK1 timer 148. Additional bit columns are typically coupled between bit columns 116 and 118 for increasing the phase correction capability of low speed clock generator 16. Each bit column corresponds to one bit of the pointer word used to control the transition point of the the $\overline{DOWN}$ signal. The present example uses a 10-bit pointer word. Thus, there are seven more bit columns not shown between bit columns 116 and 118.

Figure 8:
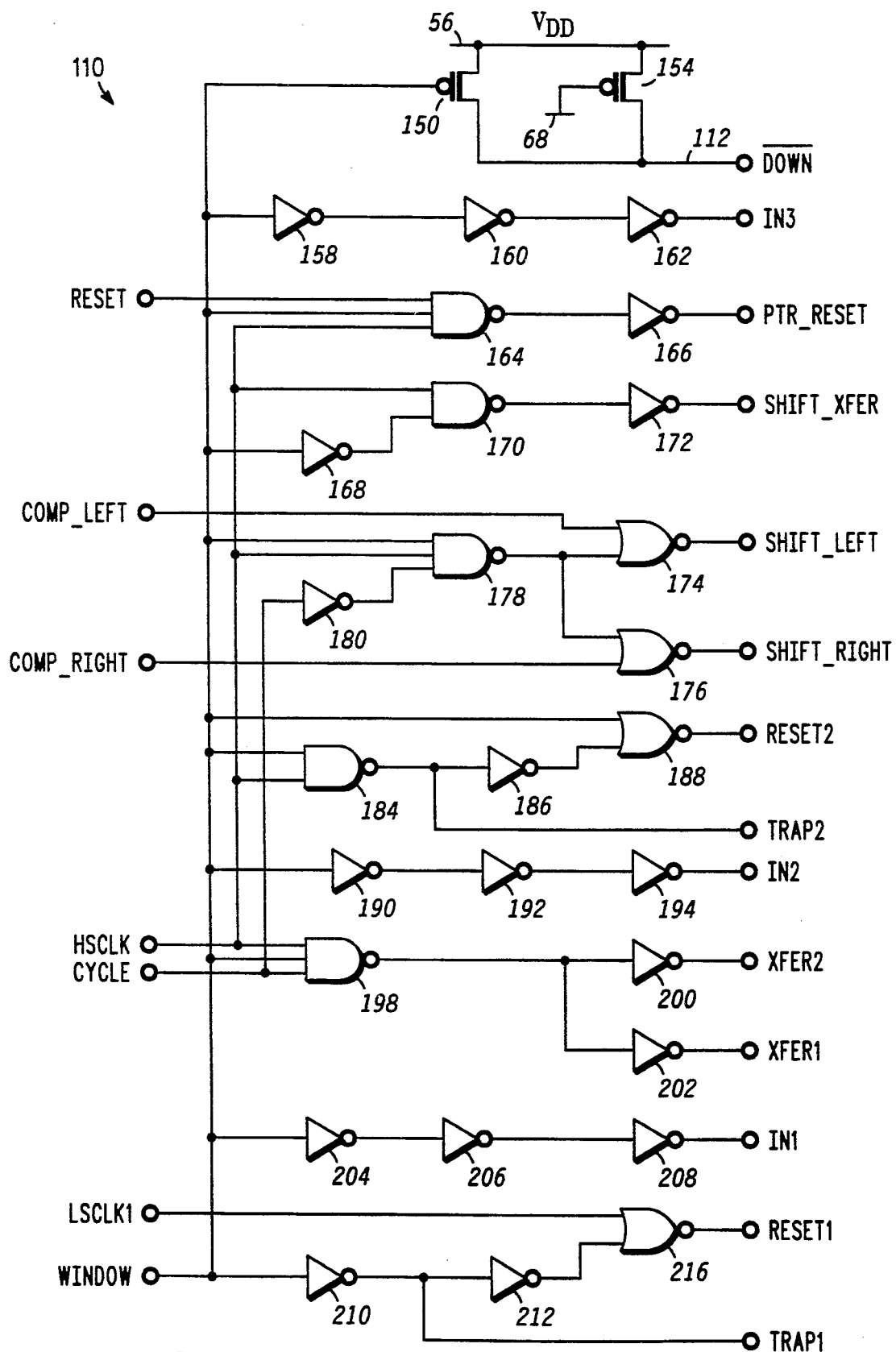
FIG. 8 is a schematic diagram illustrating the logic circuit of FIG. 7.

Further detail of logic circuit 110 is shown in FIG. 8 including transistor 150 having a gate coupled for receiving the WINDOW signal, a source coupled to power supply conductor 56 and a drain coupled to the drain of transistor 154 at conductor 112 for providing the $\overline{DOWN}$ signal. The source of transistor 154 is also coupled to power supply conductor 56 and its gate is coupled to power supply conductor 68. Transistor 150 holds the $\overline{DOWN}$ signal at logic one when the WINDOW signal is logic zero. Transistor 154 is much smaller than transistor 150 allowing the latter to overcome transistor 154 when the WINDOW signal is logic zero, while providing sufficient drive to maintain conductor 112 at logic zero when the $\overline{DOWN}$ signal is asserted.

The WINDOW signal is applied through inverters 158, 160 and 162 for providing the IN3 signal. NAND gate 164 includes a first input coupled for receiving the RESET signal, a second input for receiving the WINDOW signal and a third input for receiving the HSCLK clock signal. The output of NAND gate 164 is complemented by inverter 166 for providing the PTR_RESET signal for initializing bit columns 114-118. The PTR_RESET signal is asserted as a logic one when the RESET, WINDOW and HSCLK signals are all logic ones, and logic zero otherwise.

The WINDOW signal is also applied through inverter 168 to the first input of NAND gate 170, while the second input of NAND gate 170 receives the HSCLK clock signal. The output signal of NAND gate 170 is complemented by inverter 172 for providing the SHIFT_XFER signal which allows the bits of the pointer word to shift between pointers 122, 132 and 142 when the HSCLK is logic one and the WINDOW signal is low zero.

NOR gate 174 receives the COMP_LEFT signal and provides the SHIFT_LEFT signal at its output, and NOR gate 176 receives the COMP_RIGHT signal and provides the SHIFT_RIGHT signal at its output. NAND gate 178 has a first input coupled for receiving the WINDOW signal, a second input coupled for receiving the HSCLK clock signal and a third input for receiving the CYCLE signal inverted by inverter 180. Thus COMP_LEFT causes the SHIFT_LEFT signal to be asserted, while COMP_RIGHT activates the SHIFT_RIGHT signal when the WINDOW and HSCLK signal are logic one and the CYCLE signal is logic zero. The COMP_LEFT and COMP_RIGHT signals come from comparator 146 of bit column 118 indicating the phase relationship between the HSCLK clock signal and the LSCLK1 clock signal relative to the rising edge of the WINDOW signal.

The first input of NAND gate 184 receives the WINDOW signal, while the second input receives the HSCLK clock signal. The output signal of NAND gate 184 is applied through inverter 186 to the first input of NOR gate 188. The second input of NOR gate 188 receives the WINDOW signal for providing the RESET2 signal. The TRAP2 signal is provided at the output of NAND gate 184, and the IN2 signal is derived from the WINDOW signal inverted an odd number of times by inverters 190, 192 and 194. NAND gate 198 receives the HSCLK clock signal, the WINDOW signal and the CYCLE signal for providing the XFER1 signal and the XFER2 signal inverted by inverters 200 and 202, respectively. The WINDOW signal is also inverted an odd number of times through inverters 204, 206 and 208 for providing the IN1 signal. The LSCLK1 clock signal is applied through inverters 210 and 212 to the first input of NOR gate 216, while the second input of NOR gate 216 receives the WINDOW signal. The TRAP1 signal is provided at the output of inverter 210, and the RESET1 is provided at the output of NOR gate 216.

Figure 9:
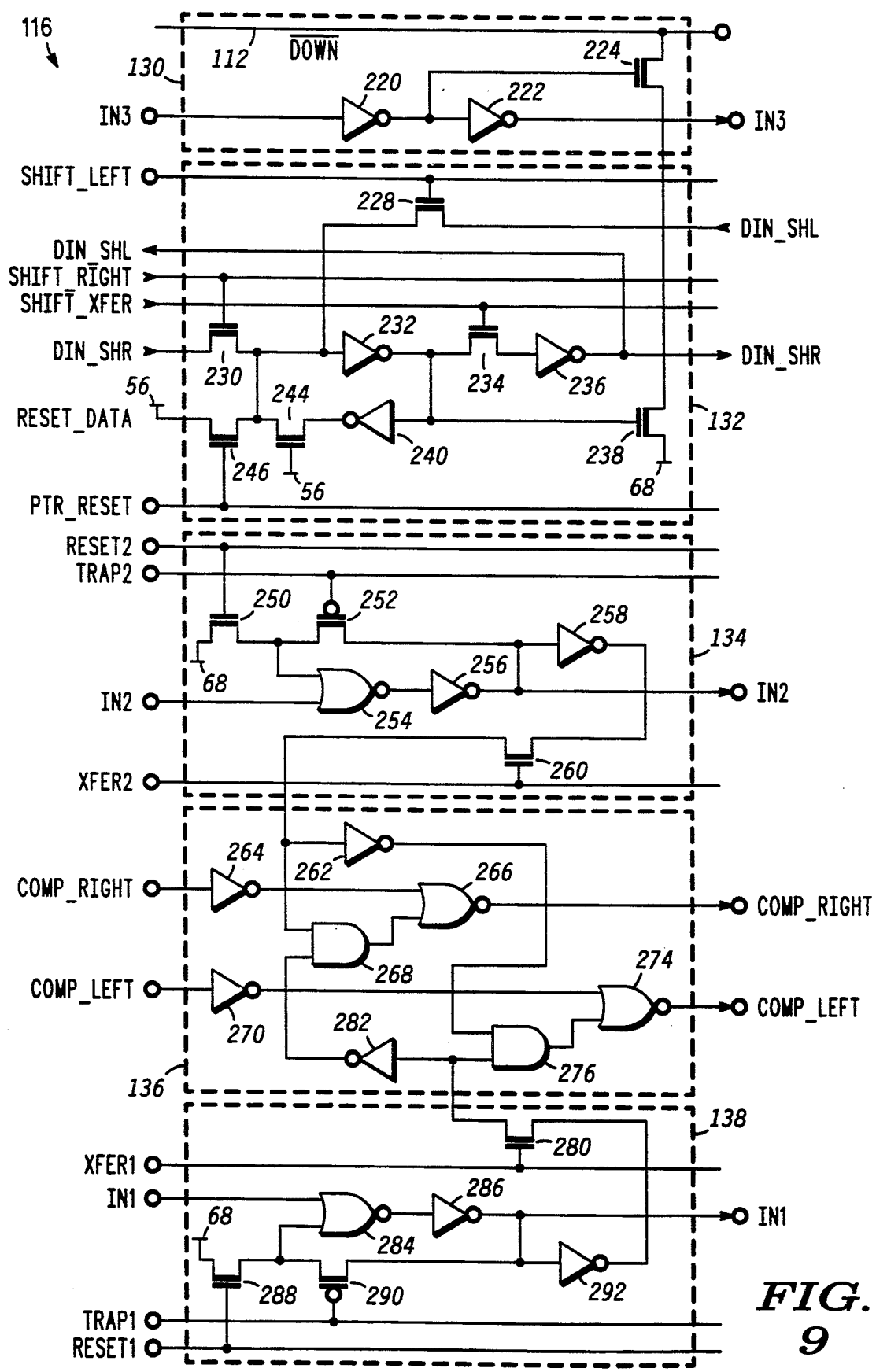
FIG. 9 is a schematic diagram illustrating one bit column of FIG. 7.

Bit column 116 is shown in FIG. 9, wherein delay circuit 130 includes inverters 220 and 222 for delaying the IN3 signal. The IN3 signal at the output of inverter 222 is applied to the next bit column. The output of inverter 220 is coupled to the gate of transistor 224 which includes a drain coupled to conductor 112.

Pointer 132 includes transistor 228 having a gate coupled for receiving the SHIFT_LEFT signal and a drain for receiving the DIN_SHL signal from pointer 142. The gate of transistor 230 receives the SHIFT_RIGHT signal, while its drain receives the DIN_SHR signal from pointer 122. The source of transistor 230 is coupled to the source of transistor 228 and through inverter 232 to the drain of transistor 234. The gate of transistor 234 receives the SHIFT_XFER signal, while its source provides the DIN_SHR signal to pointer 142 complemented by inverter 236. The output of inverter 232 is also coupled to the gate of transistor 238 and through inverter 240 to the drain of transistor 244. The drain of transistor 238 is coupled to the source of transistor 224, and the source of transistor 238 is coupled to power supply conductor 68. The gate of transistor 244 is coupled to power supply conductor 56, while its source is coupled to the input of inverter 232 and to the drain of transistor 246. The gate of transistor 246 receives the PTR_RESET signal and its source receives a hard-wired RESET_DATA logic signal. In the present example, the leftmost pointers receive a logic one RESET_DATA signal and the rightmost pointers receive a logic zero RESET_DATA signal for initializing the pointer word to "0000011111". The ten bits of the pointer word are developed one each at the output of inverters 232 in the ten pointers 122, 132 through 142.

Continuing with HSCLK timer 134, transistor 250 includes a source coupled to power supply conductor 68, a gate coupled for receiving the RESET2 signal and a drain coupled to the drain of transistor 252 and to the first input of NOR gate 254. The second input of NOR gate 254 receives the IN2 signal from HSCLK timer 124, while the output of NOR gate 254 provides the IN2 signal to HSCLK timer 144 inverted by inverter 256. The output of inverter 256 is also coupled to the source of transistor 252 and through inverter 258 to the drain of transistor 260. The gates of transistors 252 and 260 receive the TRAP2 signal and the XFER2 signal, respectively. The source of transistor 260 is routed to the input of inverter 262 which is part of comparator 136.

The COMP_RIGHT signal is applied through inverter 264 to the first input of NOR gate 266 for providing the COMP_RIGHT signal at its output to comparator 146. The second input of NOR gate 266 is coupled to the output of AND gate 268, the latter of which receives one input from the source of transistor 260. The COMP_LEFT signal from comparator 126 is applied through inverter 270 to the first input of NOR gate 274 for providing the COMP_LEFT signal at its output to comparator 146. The first input of AND gate 276 is coupled to the output of inverter 262, and the output of AND gate 276 is coupled to the second input of NOR gate 274.

LSCLK1 timer 138 includes transistor 280 having a gate coupled for receiving the XFER1 signal and a source coupled to the second input of AND gate 276 and through inverter 282 to the second input of AND gate 268. The IN1 signal is applied at the first input of NOR gate 284, while the output signal of NOR gate 284 is complemented by inverter 286 for providing the IN1 signal to HSCLK timer 148. The RESET1 signal is applied at the gate of transistor 288 which includes a source coupled to power supply conductor 68 and a drain coupled to the second input of NOR gate 284 and to the drain of transistor 290. The gate of transistor 290 receives the TRAP1 signal, while its source is coupled to the output of inverter 286 and through inverter 292 to the drain of transistor 280.

Initially, the PTR_RESET signal sets the pointer word to a known value, say "0000011111" by turning on transistors like 246 and passing the respective hard-wired logic signal RESET_DATA through transistor 246 and inverter 232 where each is locked in place by inverters like 240 and transistors like 244. The zero-one boundary of the pointer word determines which pointer-delay circuit combination triggers the $\overline{\text{DOWN}}$ signal. For example, a pointer word value of "0111111111" would provide a logic zero at the gate of transistor 238 in pointer 122 and a logic one at the gate of transistor 238 in pointer 132. Thus, the IN3 signal which is the WINDOW signal delayed by three inverters 158-162 is further delayed by inverters 220 and 222 of delay circuit 120 and by inverter 220 of delay circuit 130. Once the output of inverter 220 of delay circuit 130 becomes logic one, transistor 224 of delay circuit 130 and transistor 238 of pointer 132 conduct simultaneously and pull conductor 112 to the logic zero at power supply conductor 68. Thus, the pointer word "0111111111" triggers the $\overline{\text{DOWN}}$ signal six inverter delays (inverters 158-162, inverters 220-222 of delay circuit 120 and inverters 220 of delay circuit 130) after the rising edge of the WINDOW signal.

Also during the high state of the WINDOW signal, the time between the rising edge of the WINDOW signal and the following edges of the HSCLK clock signal and the LSCLK1 clock signal is determined by HSCLK timers 124, 134 through 144, comparators 126, 136 through 146 and LSCLK1 timers 128, 138 through 148. The zero-one boundary in the pointer word is adjusted to the right, or to the left, depending on the phase difference between the HSCLK and LSCLK1 clock signals.

Figure 4A:
FIGS. 4A–4F are waveform plots useful in the explanation of the present invention.
Figure 4B:
Figure 4C:
Figure 4D:
Figure 4E:
Figure 4F:
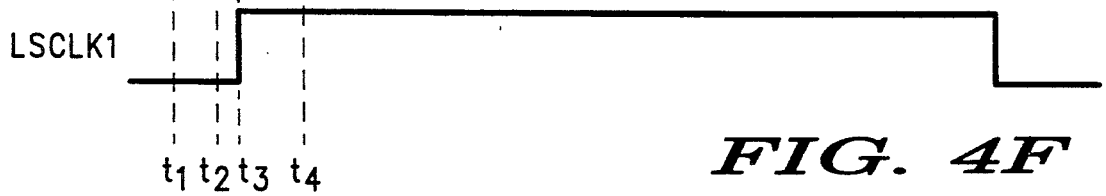

Consider the previous example with a pointer word of "0111111111" and further assume that the LSCLK1 clock signal leads the HSCLK clock signal as shown in FIGS. 4A and 4F. HSCLK timers 124, 134 through 144 detect the time difference between the rising edge of the WINDOW signal and the rising edge of the HSCLK clock signal. The RESET2 signal establishes a logic zero at the first input of NOR gate 254 via transistor 250 just prior to the rising edge of the WINDOW signal. The IN2 signal is the WINDOW signal delayed by inverters 190-194 in logic circuit 110, and the TRAP2 signal is a NAND combination of the WINDOW and HSCLK signals. The logic zero WINDOW signal prior to time $t_2$ produces a logic one IN2 signal and logic ones at the output of inverters 256 in each of HSCLK timers 124, 134 through 144. Since the HSCLK clock signal transitions after the WINDOW signal, the TRAP2 signal occurs sometime after the IN2 signal. Thus, the purpose of the HSCLK timers is to determine the time difference between the IN2 signal (initiated by WINDOW) and the TRAP2 signal (initiated by HSCLK).

The IN2 signal is delayed in each HSCLK timer block by NOR gate 254 and inverter 256 while the TRAP2 signal has a straight feed to the gate of transistors like 252. If the IN2 signal reaches the second input of NOR gate 254 before the TRAP2 signal reaches the gate of transistor 252, then transistor 252 passes a logic zero from the output of inverter 256 back to the first input of NOR gate 254. At some point, the TRAP2 signal catches up with the IN2 signal, since the latter is delayed in each HSCLK timer block, and turns on transistor 252 to conduct the initial logic one at the output of inverter 256 back to the first input of NOR gate 254 before the logic zero IN2 signal arrives. Thus, the output of inverters 256 in the HSCLK timers where the IN2 signal arrived first is logic zero, and the output of inverters 256 in the HSCLK timers where the TRAP2 signal arrived first is logic one. Inverter 258 complements the output signal of inverter 256, while a logic one XFER2 signal enables transistor 260 to pass the signal to the input of inverter 262. LSCLK1 timers 128, 138 through 148 operate in the same manner as described for HSCLK timers 124, 134 through 144, wherein the output of inverters 286 in the LSCLK1 timers are logic zero when the IN1 signal arrives first and logic one when the TRAP1 signal arrives first.

Comparators 126, 136 through 146 compare the output signals of inverters 258 and 292 for each HSCLK timer and LSCLK1 timer combination. The COMP_RIGHT signal at the output of NOR gate 266 is logic zero if the output signal of inverter 292 becomes logic zero while the output signal of inverter 258 is a logic one, and the COMP_RIGHT signal is logic one otherwise. Likewise, the COMP_LEFT signal at the output of NOR gate 274 is logic zero if the output signal of inverter 258 is a logic zero and the output signal of inverter 292 is a logic one, and the COMP_LEFT signal is logic one otherwise. Once a COMP_RIGHT or a COMP_LEFT signal at the output of a comparator becomes logic zero, then all respective COMP_RIGHT signals, or COMP_LEFT signals, further downstream are logic zeroes.

Hence, the COMP_RIGHT and COMP_LEFT signal combination at the output of comparator 146 is "01" if the HSCLK clock signal occurred after the LSCLK1 clock signal, "10" if the HSCLK clock signal occurred before the LSCLK1 clock signal, and "11" if the HSCLK and LSCLK1 clock signal occurred within two inverter delays (220-222) of one another. The COMP_RIGHT and COMP_LEFT signal are routed back through logic circuit 110 for providing the SHIFT_LEFT and SHIFT_RIGHT signals at the outputs of NOR gates 174 and 176, respectively.

A COMP_RIGHT and COMP_LEFT signal combination of "01" causes the SHIFT_RIGHT signal to assert a logic one and shift the pointer word one bit to the right by enabling transistor 230 and passing the logic one from the output of inverter 236 in the previous bit column through inverter 232, thereby producing a logic zero at the gate of transistor 238. For example, a SHIFT_RIGHT signal changes the pointer word "0111111111" to "0011111111". Alternately, COMP_RIGHT and COMP_LEFT signal combination of "10" causes the SHIFT_LEFT signal to assert a logic one and shift the pointer word one bit to the left by enabling transistor 228 and passing the logic zero from the output of inverter 236 in the next bit column through inverter 232, thereby producing a logic one at the gate of transistor 238. Thus, a SHIFT_LEFT signal changes the pointer word "0011111111" to "0111111111".

With the LSCLK1 clock signal leading the HSCLK clock signal, one of the LSCLK1 timers trips before a HSCLK timer trips, thereby producing a logic zero COMP_RIGHT signal. The SHIFT_RIGHT signal activates and moves the pointer word one bit to the right (i.e., "0111111111" to "0011111111") setting up the $\overline{\text{DOWN}}$ signal to switch to logic zero two inverter delays later during the high state of the WINDOW signal and delaying the transition of the LSCLK1 clock signal accordingly. The comparison and pointer update cycle completes during the low state of the WINDOW signal. The HSCLK and LSCLK1 clock signals are compared again until alignment is achieved as indicated by a "11" COMP_RIGHT and COMP_LEFT signal combination.

The delay adjustment range between the rising edge of the WINDOW signal and the falling edge of the $\overline{\text{DOWN}}$ signal is four inverter delays for a pointer word of "1111111111" and twenty-two inverter delays for a pointer word of "0000000000" with incremental steps of two inverter delays. Each inverter delay is about 250 picoseconds, thus the phase detection resolution between HSCLK and LSCLK1 is 500 picoseconds.

Hence, what has been provided is a novel clock alignment circuit responsive to a high speed clock signal for generating a low speed clock signal. A low speed clock generator circuit monitors the phase difference between the high speed clock signal and the low speed clock signal and develops a control signal in response thereto during a time slot window signal for adjusting the transitions of the low speed clock signal to align with the high speed clock signal. The clock generator circuit is placed in the vicinity of the associated utilization circuit so that the low speed and high speed clock signals maintain alignment.

I claim:

1. A circuit for aligning a first clock signal to a second clock signal, comprising:

first means for generating a time slot window signal in response to the second clock signal; and second means having first and second inputs coupled for receiving the second clock signal and said time slot window signal respectively and having an output for providing the first clock signal, said second means detecting a phase difference between the first clock signal and the second clock signal during said time slot window signal and adjusting a transition of the first clock signal to align with the second clock signal.

2. A circuit for aligning a first clock signal to a second clock signal, comprising:

first means for generating a time slot window signal in response to the second clock signal, said first means including an output for providing a cycle signal for controlling a state of the first clock signal; and second means having first and second inputs coupled for receiving the second clock signal and said time slot window signal respectively and having an output for providing the first clock signal, said second means detecting a phase difference between the first clock signal and the second clock signal during said time slot window signal and adjusting a transition of the first clock signal to align with the second clock signal.

3. The circuit of claim 2 wherein said second means includes:

a control circuit responsive to the first and second clock signals and said time slot window signal for providing a control signal at an output to activate the transition of the first clock signal;

a first NOR gate having first and second inputs and having an output, said first input being coupled to said output of said control circuit, said second input being coupled for receiving a complementary first clock signal; and a first driver circuit having first, second and third inputs and having an output, said first input being coupled to said output of said first NOR gate, said second input being coupled for receiving said time slot window signal, said third input being coupled for receiving said cycle signal, said output providing the first clock signal.

4. The circuit of claim 3 wherein said second means further includes:

a second NOR gate having first and second inputs and having an output, said first input being coupled to said output of said control circuit, said second input being coupled for receiving the first clock signal;

a first inverter having an input coupled for receiving said cycle signal and having an output; and a second driver circuit having first, second and third inputs and having an output, said first input being coupled to said output of said second NOR gate, said second input being coupled for receiving said time slot window signal, said third input being coupled to said output of said first inverter, said output providing said complementary first clock signal.

5. The circuit of claim 4 wherein said first means includes:

a non-overlapping clock generator having an input and first and second outputs, said input being coupled for receiving the second clock signal, said first output providing an in-phase second clock signal, said second output providing a complementary second clock signal; and a divider circuit having first and second inputs coupled for receiving said in-phase second clock signal and said complementary second clock signal respectively and having a first output for providing said time slot window signal operating at a divided down frequency from said in-phase second clock signal and a second output for providing said cycle signal for controlling the state of the first clock signal.

6. The circuit of claim 5 wherein said first driver circuit includes:

a transmission gate having an input, an output and first and second control inputs, said input being coupled to said output of said first NOR gate, said first control input being coupled for receiving said time slot window signal;

a second inverter having an input coupled for receiving said time slot window signal and having an output coupled to said second control input of said transmission gate;

a third inverter having an input coupled for receiving said cycle signal and having an output;

a first transistor having a gate, a drain and a source, said drain being coupled to said output of said third inverter, said gate being coupled for receiving said time slot window signal;

a fourth inverter having an input coupled to said source of said first transistor and having an output;

a fifth inverter having an input coupled to said output of said fourth inverter and having an output;

a second transistor having a gate, a drain and a source, said drain being coupled to said output of said fifth inverter, said gate being coupled to said output of said second inverter, said source being coupled to said input of said fourth inverter;

a NAND gate having first and second inputs and an output, said first input being coupled to said output of said transmission gate, said second input being coupled to said output of said fourth inverter;

a third transistor having a gate, a drain and a source, said source being coupled to a first source of operating potential, said gate being coupled to said output of said NAND gate, said drain being coupled to said output of said first driver circuit for providing the first clock signal; and a fourth transistor having a gate, a drain and a source, said drain being coupled to said drain of said third transistor, said gate being coupled to said output of said fifth inverter, said source being coupled to a second source of operating potential.

7. The circuit of claim 5 wherein said second driver circuit includes:

a transmission gate having an input, an output and first and second control inputs, said input being coupled to said output of said first NOR gate, said first control input being coupled for receiving said time slot window signal;

a second inverter having an input coupled for receiving said time slot window signal and having an output coupled to said second control input of said transmission gate;

a third inverter having an input coupled for receiving said cycle signal and having an output;

a first transistor having a gate, a drain and a source, said drain being coupled to said output of said third inverter, said gate being coupled for receiving said time slot window signal;

a fourth inverter having an input coupled to said source of said first transistor and having an output;

a fifth inverter having an input coupled to said output of said fourth inverter and having an output;

a second transistor having a gate, a drain and a source, said drain being coupled to said output of said fifth inverter, said gate being coupled to said output of said second inverter, said source being coupled to said input of said fourth inverter;

a NAND gate having first and second inputs and an output, said first input being coupled to said output of said transmission gate, said second input being coupled to said output of said fourth inverter;

a third transistor having a gate, a drain and a source, said source being coupled to a first source of operating potential, said gate being coupled to said output of said NAND gate, said drain being coupled to said output of said first driver circuit for providing the first clock signal; and a fourth transistor having a gate, a drain and a source, said drain being coupled to said drain of said third transistor, said gate being coupled to said output of said fifth inverter, said source being coupled to a second source of operating potential.

8. A method of aligning a first clock signal to a second clock signal, comprising the steps of:

generating a time slot window signal in response to the second clock signal;

detecting a phase difference between the first clock signal and the second clock signal during said time slot window signal; and adjusting a transition of the first clock signal according to said phase difference to align with the second clock signal.

9. The method of claim 8 wherein said step of detecting a phase difference includes the steps of:

determining a first time delay between a transition of said time slot window signal and a transition of the first clock signal;

determining a second time delay between said transition of said time slot window signal and a transition of the second clock signal; and comparing said first time delay and said second time delay to determine whether the first clock signal or the second clock signal transitioned first.

10. The method of claim 9 wherein said step of adjusting the transition of the first clock signal includes the steps of:

shifting a pointer word which controls said transition of the first clock signal such that the first clock signal changes state closer to said transition of said time slot window signal when the second clock signal transitions before the first clock signal; and shifting said pointer word such that the first clock signal changes state farther from said transition of said time slot window signal when the first clock signal transitions before the second clock signal.

11. The method of claim 10 wherein said step of generating a time slot window signal includes the steps of:

developing an in-phase second clock signal and a complementary second clock signal from the second clock signal, said in-phase second clock signal and said complementary second clock signal having non-overlapping high states;

dividing down a frequency of said in-phase second clock signal and said complementary second clock signal for providing said time slot window signal; and dividing down a frequency of said time slot window signal for providing a cycle signal for controlling a state of the first clock signal.

12. An integrated circuit for aligning a first clock signal to a second clock signal, comprising:

a non-overlapping clock generator having an input and first and second outputs, said input being coupled for receiving the second clock signal, said first output providing an in-phase second clock signal, said second output providing a complementary second clock signal;

a divider circuit having first and second inputs coupled for receiving said in-phase second clock signal and said complementary second clock signal respectively and having a first output for providing a time slot window signal operating at a divided down frequency from said in-phase second clock signal and a second output for providing a cycle signal for controlling a state of the first clock signal; and circuit means having first and second inputs coupled for receiving said in-phase second clock signal and said time slot window signal respectively and having an output for providing the first clock signal, said circuit means detecting a phase difference between the first clock signal and the second clock signal during said time slot window signal and adjusting a transition of the first clock signal to align with the second clock signal.

13. The integrated circuit of claim 12 wherein said circuit means includes:

a control circuit responsive to the first and second clock signals and said time slot window signal for providing a control signal at an output to activate the transition of the first clock signal;

a first NOR gate having first and second inputs and having an output, said first input being coupled to said output of said control circuit, said second input being coupled for receiving a complementary first clock signal; and a first driver circuit having first, second and third inputs and having an output, said first input being coupled to said output of said first NOR gate, said second input being coupled for receiving said time slot window signal, said third input being coupled for receiving said cycle signal, said output providing the first clock signal.

14. The integrated circuit of claim 13 wherein said circuit means further includes:

a second NOR gate having first and second inputs and having an output, said first input being coupled to said output of said control circuit, said second input being coupled for receiving the first clock signal;

a first inverter having an input coupled for receiving said cycle signal and having an output; and a second driver circuit having first, second and third inputs and having an output, said first input being coupled to said output of said second NOR gate, said second input being coupled for receiving said time slot window signal, said third input being coupled to said output of said first inverter, said output providing said complementary first clock signal.

15. The integrated circuit of claim 14 wherein said first driver circuit includes:
- a transmission gate having an input, an output and first and second control inputs, said input being coupled to said output of said first NOR gate, said first control input being coupled for receiving said time slot window signal;
- a second inverter having an input coupled for receiving said time slot window signal and having an output coupled to said second control input of said transmission gate;
- a third inverter having an input coupled for receiving said cycle signal and having an output;
- a first transistor having a gate, a drain and a source, said drain being coupled to said output of said third inverter, said gate being coupled for receiving said time slot window signal;
- a fourth inverter having an input coupled to said source of said first transistor and having an output;
- a fifth inverter having an input coupled to said output of said fourth inverter and having an output;
- a second transistor having a gate, a drain and a source, said drain being coupled to said output of said fifth inverter, said gate being coupled to said output of said second inverter, said source being coupled to said input of said fourth inverter;
- a NAND gate having first and second inputs and an output, said first input being coupled to said output of said transmission gate, said second input being coupled to said output of said fourth inverter;
- a third transistor having a gate, a drain and a source, said source being coupled to a first source of operating potential, said gate being coupled to said output of said NAND gate, said drain being coupled to said output of said first driver circuit for providing the first clock signal; and
- a fourth transistor having a gate, a drain and a source, said drain being coupled to said drain of said third transistor, said gate being coupled to said output of said fifth inverter, said source being coupled to a second source of operating potential.

16. The integrated circuit of claim 14 wherein said second driver circuit includes:
- a transmission gate having an input, an output and first and second control inputs, said input being coupled to said output of said first NOR gate, said first control input being coupled for receiving said time slot window signal;
- a second inverter having an input coupled for receiving said time slot window signal and having an output coupled to said second control input of said transmission gate;
- a third inverter having an input coupled for receiving said cycle signal and having an output;
- a first transistor having a gate, a drain and a source, said drain being coupled to said output of said third inverter, said gate being coupled for receiving said time slot window signal;
- a fourth inverter having an input coupled to said source of said first transistor and having an output;
- a fifth inverter having an input coupled to said output of said fourth inverter and having an output;
- a second transistor having a gate, a drain and a source, said drain being coupled to said output of said fifth inverter, said gate being coupled to said output of said second inverter, said source being coupled to said input of said fourth inverter;
- a NAND gate having first and second inputs and an output, said first input being coupled to said output of said transmission gate, said second input being coupled to said output of said fourth inverter;
- a third transistor having a gate, a drain and a source, said source being coupled to a first source of operating potential, said gate being coupled to said output of said NAND gate, said drain being coupled to said output of said first driver circuit for providing the first clock signal; and
- a fourth transistor having a gate, a drain and a source, said drain being coupled to said drain of said third transistor, said gate being coupled to said output of said fifth inverter, said source being coupled to a second source of operating potential.

* * * * *